United States Patent [19]

Rothwarf

[11] 4,267,398
[45] May 12, 1981

[54] THIN FILM PHOTOVOLTAIC CELLS
[75] Inventor: Allen Rothwarf, Philadelphia, Pa.
[73] Assignee: University of Delaware, Newark, Del.
[21] Appl. No.: 43,339
[22] Filed: May 29, 1979
[51] Int. Cl.³ .......................................... H01L 31/04
[52] U.S. Cl. ................................. 136/256; 136/260; 136/265
[58] Field of Search ........ 136/89 CD, 89 CC, 89 TF, 136/89 CU, 256, 260, 265; 357/30, 62, 65; 427/74, 248 R; 29/572; 204/192 SP

[56] References Cited
U.S. PATENT DOCUMENTS

Re. 29,812 10/1978 Jordan et al. .................... 136/89 TF
3,778,684 12/1973 Fischer et al. ......................... 357/16

OTHER PUBLICATIONS

M. Savelli et al., "Problems of the $Cu_2S/CdS$ Cell", p. 219 in *Topics in Applied Physics,* vol. 31, Springer-Verlag, (1979).
F. Pfisterer et al., "Performance of $Cu_xS$–CdS Solar Cells After Additional Cu Treatment", *Conf. Record, 11th IEEE Photovoltaic Specialists Conf.,* (1975), pp. 460-463.

*Primary Examiner*—Aaron Weisstuch
*Attorney, Agent, or Firm*—Connolly and Hutz

[57] ABSTRACT

A solar cell has as its transparent electrical contact a grid made from a non-noble metal by providing a layer of copper oxide between the transparent electrical contact and the absorber-generator.

1 Claim, 2 Drawing Figures

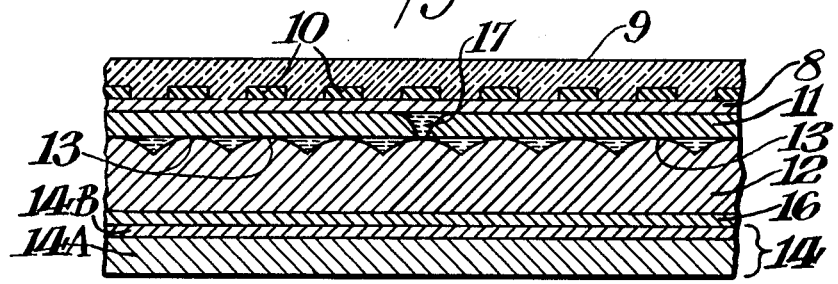
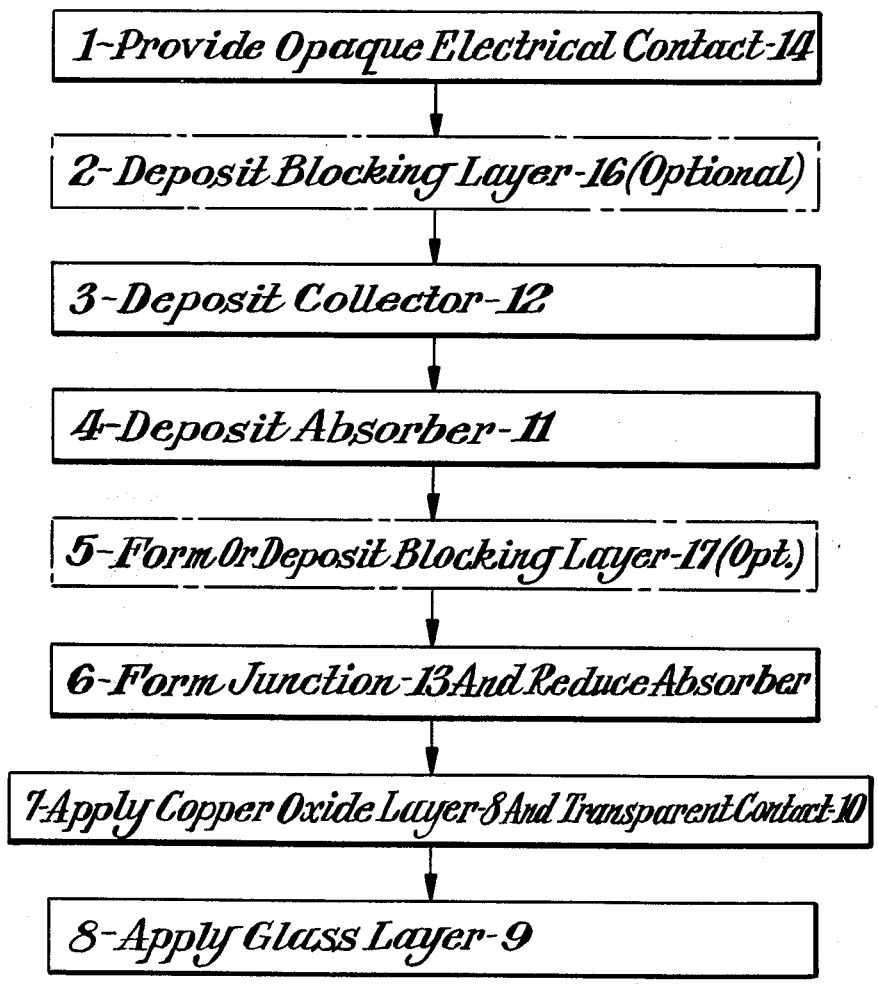

THIN FILM PHOTOVOLTAIC CELLS

The Government has rights in this invention pursuant to Contract No. DE-AC-03-77-ET-20430 awarded by the U.S. Department of Energy.

BACKGROUND OF INVENTION

1. The Nature of Photovoltaic Cells

A photovoltaic cell, often referred to as a solar cell, is a semiconductor junction device which converts light energy into electrical energy. A typical photovoltaic cell is a layered structure comprising four principal layers: (1) an absorber-generator (2) a collector-converter (3) a transparent electrical contact and (4) an opaque electrical contact. When light is shone onto the absorber-generator, the device generates a voltage differential between the two contacts and an electric current which increases as the intensity of the light increases.

The absorber-generator (commonly referred to as the "absorber") is a layer of semiconductor material which absorbs light photons and, as a consequence, generates minority carriers. Typically the absorber absorbs photons and ejects electrons thus creating pairs of negatively charged carriers (electrons) and positively charged carriers ("holes"). If the absorber is a p-type semiconductor, the electrons are minority carriers; if it is n-type, the holes are minority carriers. As minority carriers are readily annihilated in the absorber by recombination with the plentiful majority carriers, they must be transported to a region wherein they are majority carriers before they can be utilized to power an electrical circuit.

The collector-converter (the "collector") is a layer of material in electrical contact with the absorber wherein the majority carriers are of the same conductivity type as the minority carriers generated in the absorber. This layer "collects" minority carriers from the absorber and "converts" them into majority carriers. If the collector is an oppositely doped region of the same semiconductor as the absorber, the photovoltaic device is a homojunction device. If the collector is comprised of a different semiconductor, the device is a heterojunction; and, if the collector is metal, the device is a Schottky barrier junction.

The transparent contact is made of an electrically conductive material which permits light to pass through to the absorber. It is typically either a continuous transparent sheet of conductive material or an open grid of opaque conductive material. If the transparent contact is on the same side of the photovoltaic device as the absorber, the device is referred to as being in the front wall configuration. If the transparent contact is on the opposite side, the device is said to be in the back wall configuration.

2. History of the Art

Although scientists have known about the photovoltaic effect for more than a century, it is only within the past twenty-five years that it could be considered a practical means for generating electricity in useful amounts. Prior to 1950, photovoltaic devices were limited in use to highly specialized applications, such as light metering, wherein conversion efficiency was immaterial and electrical current demand was minimal.

The advent of silicon junction technology in the 1950's permitted the development of high cost, high conversion efficiency silicon junction photovoltaic cells. Arrays of such devices have been used with considerable success in the space program where cost is of little significance. However, the cost of such devices as energy generators, typically exceeding $10,000 per kilowatt, is prohibitively high for terrestrial applications wherein they must compete against conventional generators. While much of this cost is due to the high quality control standards required for spacecraft components, a substantial portion is due to the high cost of preparing silicon crystals of the required purity and due to the inefficiencies of the batch processes by which such cells are fabricated.

Thin film photovoltaic cells possess many potential advantages over silicon cells in terrestrial applications. Photovoltaic cells employing thin films of polycrystalline materials such as a copper sulfide absorber and a cadmium sulfide converter offer substantial advantages for the development of continuous processing techniques, and they are flexible and light of weight. Consequently they offer much promise as cells which can be easily fabricated, transported and deployed.

One difficulty with conventional thin film photovoltaic cells is that only gold has been consistently effective as a grid material on the copper sulfide of the cadmium sulfide/copper sulfide type photovoltaic cell. As a result such cells are quite expensive thereby detracting from their otherwise economic advantages and the possibility of low cost large scale production for such cells.

SUMMARY OF INVENTION

The present applicant has recognized that, while the major reason for the ohmic contact between the gold and the copper sulfide is the compatibility of their work functions, this is not a necessary condition. With the copper sulfide stoichiometry adjusted to give about $10^{19}/cm^3$ of holes almost any high work function metal that does not dope the copper sulfide layer should make an ohmic contact to the copper sulfide. In particular, copper with a work function of about 4.5 ev, would be a good candidate for a grid material. Copper, however, would enter the copper sulfide by diffusion thereby reducing the hole concentration below the acceptable level. Applicant has reasoned that if a thin layer of, for example, copper oxide were placed on the copper sulfide layer before the deposition of the grid material, then any one of a number of metals far less expensive than gold could be used for grid metals.

In accordance with the invention, a solar cell having a copper-bearing absorber such as $Cu_2S$ is provided with an overlying diffusion barrier such as a thin layer of copper oxide and a grid made from a metal other than gold is utilized as the transparent contact. The grid material may, for example, be from such non-noble metals as copper, chromium or nickel or their alloys or may be from less expensive noble metals such as silver.

BRIEF DESCRIPTION OF THE DRAWINGS

The nature, advantages and various additional features of the invention will appear more fully upon consideration of the illustrative embodiments now to be described in detail in connection with the accompanying drawings.

In the drawings:

FIG. 1 is a schematic cross section, with portions enlarged, of a thin film photovoltaic cell in accordance with the invention; and FIG. 2 is a flow diagram of the steps of a preferred method of fabricating a thin film photovoltaic cell in accordance with the invention.

DETAILED DESCRIPTION

Referring to the drawings, FIG. 1 is a schematic cross section of a thin film photovoltaic device embodying an exemplary form of this invention. In essence, the device comprises, as successive components in the electrical path therethrough, a first transparent electrical contact means 10 in the form of a metal grid electrode, as later described; a copper-bearing absorber-generator 11, such as a thin film of copper sulfide, disposed in electrical contact with electrical grid contact 10, a collector-converter 12, such as a film of cadmium sulfide or zinc cadmium sulfide ($Zn_xCd_{1-x}S$; $0 \leq X \leq 0.3$), disposed in contact with the absorber and forming a junction 13, therewith; and a second electrical contact 14, such as a layer of zinc-plated copper foil or brass making electrical contact with the collector 12. In a typical thin film photovoltaic device, the copper sulfide absorber will have a thickness on the order of 1000 to 5000 angstroms; the cadmium sulfide collector will have a thickness of approximately 2 to 40 microns; and the copper foil 14A contact will have a zinc plate 14B of about 0.5 micron or less.

The above-described cell and the method of making it is described in greater detail in concurrently filed, commonly assigned application Ser. No. 43,316, entitled "Thin Film Photovoltaic Cells Having Increased Durability And Operating Life And Method For Making Same" and filed in the names of Allen M. Barnett et al. The details of that application are incorporated herein by reference thereto. The cell of that application includes as components thereof a composite encapsulating means consisting of an outer glass layer 9 and an underlying layer of, for example, copper oxide 8. While it is possible to practice the present invention with such encapsulation means, the inclusion of such encapsulation means is not necessary. A characteristic of the present invention is that the grid is made from a material other than gold and such is made possible by the inclusion of a diffusion barrier 8 which likewise may be a copper oxide layer.

In accordance with the broad aspects of this invention the layer 8 may be $Cu_2O$, $Al_2O_3$ or any other material whether conducting or insulating that would act as a diffusion barrier when placed on $Cu_2S$ layer 11 before deposition of grid 10 and would be thin enough to allow carrier tunneling, or conducting enough to allow carrier flow. As a result, materials other than gold (referred to herein as "non-noble metals") can be used as grid 10.

Where thin barrier layer 8 is insulating it should have a thickness of less than about 100 angstroms. When layer 8 is conductive, its thickness should be less than 1000 angstroms. If desired, layer 8 may be of the same material as used for an antireflection coating of the cell or may be of a different material.

With reference again to FIG. 1, shorts between the transparent contact 10 and the opaque contact 14 are preferably prevented by disposing a blocking layer 16 such as a thin layer of semiconductor material between the opaque contact and the collector in regions of probable shorting. In this specific embodiment, a semiconducting layer of zinc sulfide is formed on the opaque contact before deposition of the collector.

Shorts between the transparent contact 10 and the collector 12 are preferably prevented by forming between the transparent contact and the collector a thin, discontinuous blocking layer 17 of material which forms an insulator, such as cadmium sulfate.

Shorts between the absorber 11 and the opaque contact 14 are preferably prevented by forming a blocking layer of material of an electron affinity such as will not pass significant current at solar cell operating voltages. Such a material is zinc sulfide layer 16 which is deposited on the opaque contact, prior to deposition of the CdS. Reference is also made to copending application Ser. No. 944,999 filed Sept. 22, 1978, the details of which are incorporated herein by reference thereto, for a further discussion of such blocking layers.

FIG. 2 is a schematic flow diagram illustrating the preferred method for fabricating a thin film photovoltaic cell in accordance with the invention. As illustrated, the first step involves providing an opaque electrical contact which is conveniently used as a substrate during the remainder of the process. In the fabrication of the device of FIG. 1, this step is preferably effectuated by (a) providing copper foil, (b) cleaning the foil surfaces electrolytically and by immersion in sulphuric acid, and (c) depositing a thin layer of zinc on the cleaned surface by electroplating.

The next step involves forming blocking layer 16 which is preferably a layer of zinc sulfide. Such a layer is formed by depositing a 0.5 to 2 micron average thickness layer of zinc sulfide by vacuum evaporation or by chemical desposition.

The next step involves depositing a collector-converter. In fabricating the device of FIG. 1, this step is preferably effected by evaporation deposition of a cadmium sulfide collector. The collector surface can also be textured by etching in hydrochloric acid, to promote efficient light collection. A two to four second dip in 55% V/V concentration HCl at 60° C. has been found satisfactory.

The next step involves depositing an absorber-generator on the collector and forming a junction between the absorber and the collector. In the fabrication of the FIG. 1 device, this step is preferably effectuated by growing $Cu_2S$ on the CdS by an ion exchange process using an aqueous solution of cuprous chloride. A ten-second dip has been found satisfactory in the following bath composition, from which oxygen has been excluded:

| Component | Quantity |
| --- | --- |
| Deionized water | 4 liters |
| CuCl | 24 grams |
| NaCl | 8 grams |
| HCl | pH of 2-3 |
| Temperature | 90-100° C. |

Any portion of the cadmium sulfide not covered by the absorber can advantageously be converted into a cadmium sulfate blocking layer 17 by heat treating the structure in an oxygen containing atmosphere such as air at a temperature of 200° C. for two minutes.

The resulting structure is then heat treated in a reducing atmosphere to complete the formation of an acceptable junction between the cadmium sulfide and the copper sulfide and to take the copper sulfide to its desired stoichiometric condition. During the heat treatment, copper diffuses into the cadmium sulfide and "dopes" it in the interfacial region and below. In addition the reducing atmosphere chemically reduces oxides, such as $Cu_2O$, that form on the free surface of the $Cu_2S$ without completely reducing the cadmium sulfate layer 17. A ten-hour heat treatment in a 90% argon-10% hydrogen atmosphere at 170° C. has been found satisfactory. Alternatively, exposure to either a 10% hydrogen-90% argon atmosphere or a carbon monoxide atmosphere at 300° C. for two minutes is also satisfactory.

After the surface has been heated, reduced and thereby dried, a thin layer of copper oxide 8 is applied. Advantageously as a preliminary step, a thin layer of copper approximately 50 angstroms thick can be deposited onto the copper sulfide by vacuum evaporation or electrochemical techniques, and the resulting structure heated in air at approximately 200° C. for ten minutes. Then sufficient additional copper oxide is deposited by standard vacuum evaporation or sputtering techniques to produce a copper oxide layer having a total thickness preferably between 100 and 1000 angstroms. The advantage of the initial copper plating step is that some copper atoms are driven into the copper sulfide, assuring optimum stoichiometry.

The transparent contact in the form of a grid is applied to the copper oxide coated surface by printing or vacuum evaporation through a suitable mask.

The final step involves applying over the grid and copper oxide, a layer of glass having a thickness of 1 to 30 microns. The glass can be deposited by standard thermal evaporation, by sputtering or by flame or plasma spraying. If desired, the top surface of the glass can be textured in order to maximize trapping of light entering the device.

It is to be understood that throughout this specification and the appended claims that the term copper-bearing absorber embraces not only a layer of copper sulfide, but also other copper-bearing compounds useful as absorbers in photovoltaic cells, such as copper indium selenide ($CuInSe_2$) and copper indium sulfide ($CuInS_2$).

While the invention has been described in connection with but a small number of specific embodiments, it is to be understood that these are merely illustrative of many other specific embodiments which can also utilize the principles of the invention. For example, while the invention has been described in connection with only copper-bearing absorbers, it also has application to photovoltaic cells having other types of absorbers compatible with copper oxide, such as zinc phosphide and amorphous silicon. Thus, numerous and varied devices can be made by those skilled in the art without departing from the spirit and scope of the present invention.

What is claimed is:

1. In a front wall photovoltaic cell of the type comprising an opaque electrical contact, a collector on and in ohmic electrical contact with said opaque electrical contact, an absorber on and in rectifying electrical contact with said collector and forming a junction therewith, a transparent electrical contact in ohmic electrical contact with said absorber, and an antireflection coating, the improvement being said absorber being a copper bearing material, said transparent electrical contact being in the form of a grid made from a material selected from the group consisting of copper, silver, chromium, nickel and their alloys, a diffusion barrier layer deposited on said absorber and providing a continuous layer between said absorber and said grid, and said diffusion barrier layer being of the same material as the material as of said antireflection coating.

* * * * *